US008916428B2

(12) United States Patent
Wang et al.

(10) Patent No.: US 8,916,428 B2
(45) Date of Patent: Dec. 23, 2014

(54) METHOD OF FORMING A SEMICONDUCTOR DEVICE

(75) Inventors: Tsan-Chun Wang, Hsinchu (TW); Chun Hsiung Tsai, Xinpu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 112 days.

(21) Appl. No.: 13/343,891

(22) Filed: Jan. 5, 2012

(65) Prior Publication Data

US 2013/0178029 A1   Jul. 11, 2013

(51) Int. Cl.
*H01L 21/336*   (2006.01)
*H01L 21/338*   (2006.01)
*H01L 29/10*   (2006.01)

(52) U.S. Cl.
USPC ........... 438/183; 438/184; 438/196; 438/296; 438/230; 438/303; 438/405; 438/394; 257/374; 257/61; 257/E21.626; 257/E21.235; 257/E21.415

(58) Field of Classification Search
CPC ..................... H01L 21/28141; H01L 21/0337; H01L 21/823468; H01L 21/823874; H01L 21/2815; H01L 21/28132; H01L 21/3066; H01L 21/8234; H01L 21/823814; H01L 21/28105; H01L 21/26506; H01L 21/823807; H01L 21/823841; H01L 21/823878; H01L 29/4908; H01L 29/4983; H01L 29/78696; H01L 29/66772; H01L 29/78621; H01L 29/6653; H01L 29/66636; H01L 29/7848; H01L 29/7847; H01L 29/7833; H01L 29/6659; H01L 29/66492
USPC ......... 438/183, 294, 184, 230, 938, 301, 303, 438/595, 285, 276, 289, 528, 304, 305, 696, 438/405; 257/374, 61, 408, 390, 347, 350, 257/E21.64, E21.038, E21.569, E21.6, 257/18–E21.635, E21.235, E21.196, 257/E21.415, E21.431, E21.433, E29.151, 257/E29.152, E29.278, E29.275, E29.286, 257/E29.665

See application file for complete search history.

(56) References Cited

U.S. PATENT DOCUMENTS

| | | | | |
|---|---|---|---|---|
| 5,770,506 | A * | 6/1998 | Koh | 438/303 |
| 2006/0060904 | A1* | 3/2006 | Hong | 257/298 |
| 2007/0007509 | A1* | 1/2007 | Shaheen | 257/19 |
| 2007/0252205 | A1* | 11/2007 | Hoentschel et al. | 257/347 |
| 2007/0281413 | A1* | 12/2007 | Li et al. | 438/201 |
| 2008/0003789 | A1* | 1/2008 | Chen et al. | 438/585 |
| 2009/0166755 | A1* | 7/2009 | Chakravarthi et al. | 257/390 |
| 2009/0176354 | A1* | 7/2009 | Rajendran et al. | 438/487 |
| 2011/0057270 | A1* | 3/2011 | Nishikawa | 257/408 |
| 2012/0108021 | A1* | 5/2012 | Mehrotra | 438/231 |

* cited by examiner

*Primary Examiner* — Julio J Maldonado
*Assistant Examiner* — Moazzam Hossain
(74) *Attorney, Agent, or Firm* — Lowe Hauptman & Ham, LLP (57) ABSTRACT

A semiconductor device having dislocations and a method of fabricating the semiconductor device is disclosed. The exemplary semiconductor device and method for fabricating the semiconductor device enhance carrier mobility. The method includes providing a substrate having an isolation feature therein and two gate stacks overlying the substrate, wherein one of the gate stacks is atop the isolation feature. The method further includes performing a pre-amorphous implantation process on the substrate. The method further includes forming spacers adjoining sidewalls of the gate stacks, wherein at least one of the spacers extends beyond an edge the isolation feature. The method further includes forming a stress film over the substrate. The method also includes performing an annealing process on the substrate and the stress film.

20 Claims, 10 Drawing Sheets

METHOD OF FORMING A SEMICONDUCTOR DEVICE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

With reference to FIGS. 1 and 2-10, a method 100 and a semiconductor device 200 are collectively described below. The semiconductor device 200 illustrates an integrated circuit, or portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may include passive components, such as resistors, capacitors, inductors, and/or fuses. It is understood that the semiconductor device 200 may be formed by CMOS technology processing, and thus some processes are not described in detail herein. Additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 1:
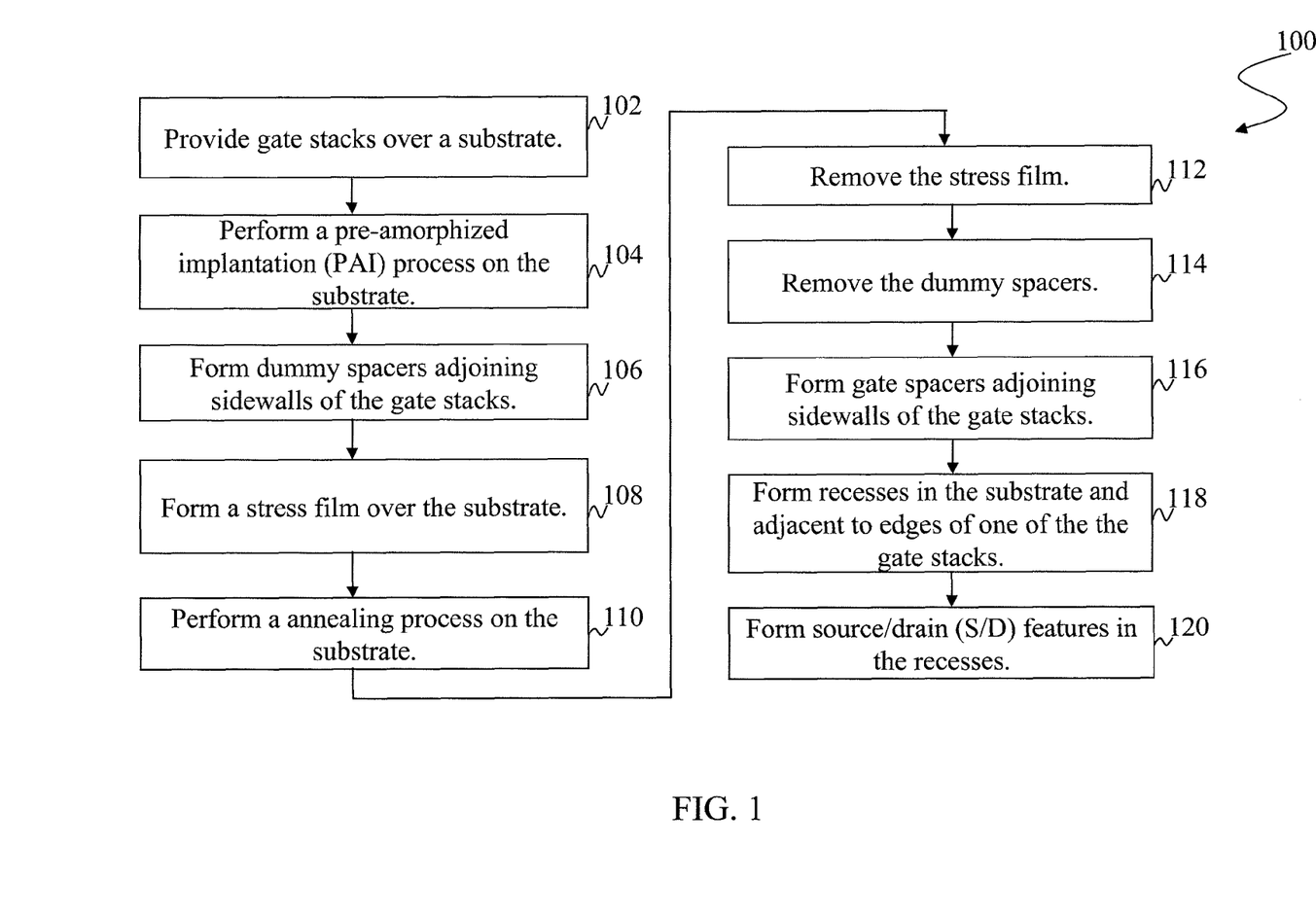
FIG. 1 is a flowchart illustrating a method of forming a semiconductor device according to various aspects of the present disclosure.

Referring to FIG. 1, a method 100 for fabricating a semiconductor device is described according to various aspects of the present disclosure. The method 100 begins with step 102 in which gate stacks over a substrate is provided. The method 100 continues with step 104 in which a pre-amorphous implantation (PAI) process is performed on the substrate. The method 100 continues at step 106 in which dummy spacers are formed adjoining sidewalls of the gate stacks. The method 100 continues at step 108 in which a stress film is deposited over the substrate. The method 100 continues at step 110 in which an annealing process is performed on the substrate. The method 100 continues at step 112 in which the stress film is removed. The method 100 continues at step 114 in which the dummy spacers are removed. The method 100 continues at step 116 in which gate spacers are formed adjoining sidewalls of the gate stacks. The method 100 continues at step 118 in which recesses are formed in the substrate and adjacent to edges of one of the gate stacks. The method 100 continues at step 120 in which source/drain (S/D) features are formed in the recesses. The discussion that follows illustrates various embodiments of a semiconductor device 200 that can be fabricated according to the method 100 of FIG. 1.

Figure 2:
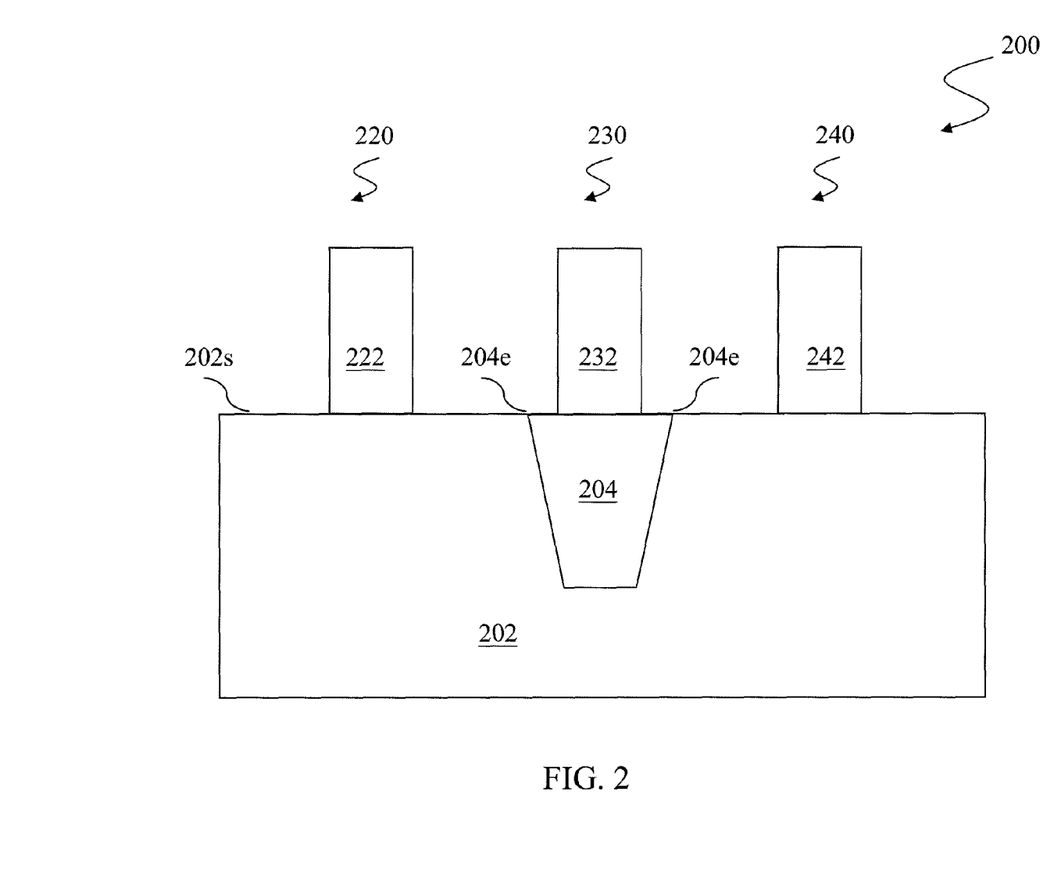
FIGS. 2 to 10 illustrate diagrammatic cross-sectional side views of some embodiments of a semiconductor device at various stages of fabrication according to the method of FIG. 1.

FIGS. 2 to 10 illustrate diagrammatic cross-sectional side views of one embodiment of a semiconductor device 200 at various stages of fabrication according to the method 100 of FIG. 1. Referring to FIGS. 1 and 2, the method 100 begins at step 102 wherein a substrate 202 is provided. The substrate 202 has a surface 202s. In the present embodiment, the substrate 202 is a semiconductor substrate including silicon. Alternatively, the substrate 202 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient SiGe feature in which the Si and Ge composition change from one ratio at one location to another ratio at another location of the gradient SiGe feature.

The alloy SiGe could be formed over a silicon substrate, and/or the SiGe substrate may be strained. In yet another alternative, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

In some embodiment, the substrate 202 includes an isolation region 204 to define and isolate various active regions of the substrate 202. The isolation region 204 has edges 204e intersecting with the surface 202s of the substrate 202. The isolation region 204 utilizes isolation technology, such as shallow trench isolation (STI) or local oxidation of silicon (LOCOS), to define and electrically isolate the various regions. In some embodiment, the isolation region 204 includes silicon oxide, silicon nitride, silicon oxynitride, other suitable materials, or combinations thereof.

With further reference to FIG. 2, gate structures 220, 230, and 240 are formed over the substrate 202. In the present embodiment, the gate structure 220 and the gate structure 240 are disposed over channel regions for a NMOS device and a PMOS device, respectively. In the present embodiment, the gate structure 230 is a dummy structure and disposed over the isolation region 204. The substrate 202 may further include a source region and a drain region on both sides of each of the gate structures 220 and 240, the channel regions being the regions between the source regions and the drain regions. In the present embodiment, source and drain features (also referred to as strained structures) (not shown) are formed in the source and drain regions on both sides of the gate structure 240. The source and drain features may alternatively be referred to as raised source and drain regions formed on the substrate 202. In some embodiments, a semiconductor material is formed in recesses of substrate 202 using an epitaxial (epi) process for forming the source and drain features. In some embodiments, the semiconductor material comprises a material different from the substrate 202 to provide a stress (strain) on the channel region of the PMOS device to enable carrier mobility of the device and enhance device performance. In some embodiments, the source and drain features of the gate structure 240 comprise silicon germanium (SiGe) formed by an epi process. The gate structures 220, 230, and 240 include various gate material layers. In the present embodiment, the gate structures 220, 230, and 240 include gate stacks 222, 232, and 242 (also referred to as gate electrodes), respectively.

The gate stacks 222, 232, and 242 are formed over the substrate 202 to a suitable thickness. In an example, the gate stacks 222, 232, and/or 242 comprise a polycrystalline silicon (or polysilicon) layer. The polysilicon layer may be doped for proper conductivity. Alternatively, the polysilicon is not doped, for example, if a dummy gate is to be formed and later replaced by a gate replacement process. In another example, the gate stacks 222, 232, and/or 242 comprise a conductive layer having a proper work function, therefore, the gate stacks 222, 232, and/or 242 can also be referred to as a work function layer. The work function layer includes a suitable material, such that the layer can be tuned to have a proper work function for enhanced performance of the device. For example, if a P-type work function metal (P-metal) for a PMOS device is desired, TiN or TaN may be used. On the other hand, if an N-type work function metal (N-metal) for an NMOS device is desired, Ta, TiAl, TiAlN, or TaCN, may be used. The work function layer could include doped conducting oxide materials. The gate stacks 222, 232, and/or 242 could include other conductive materials, such as aluminum, copper, tungsten, metal alloys, metal silicide, other suitable materials, and/or combinations thereof. The gate stacks 222, 232, and/or 242 could include multiple layers. For example, where the gate stacks 222, 232, and/or 242 include a work function layer; another conductive layer can be formed over the work function layer. The gate stacks 222, 232, and/or 242 are formed by chemical vapor deposition (CVD), physical vapor deposition (PVD), atomic layer deposition (ALD), high density plasma CVD (HDPCVD), plating, other suitable methods, and/or combinations thereof.

Figure 3:
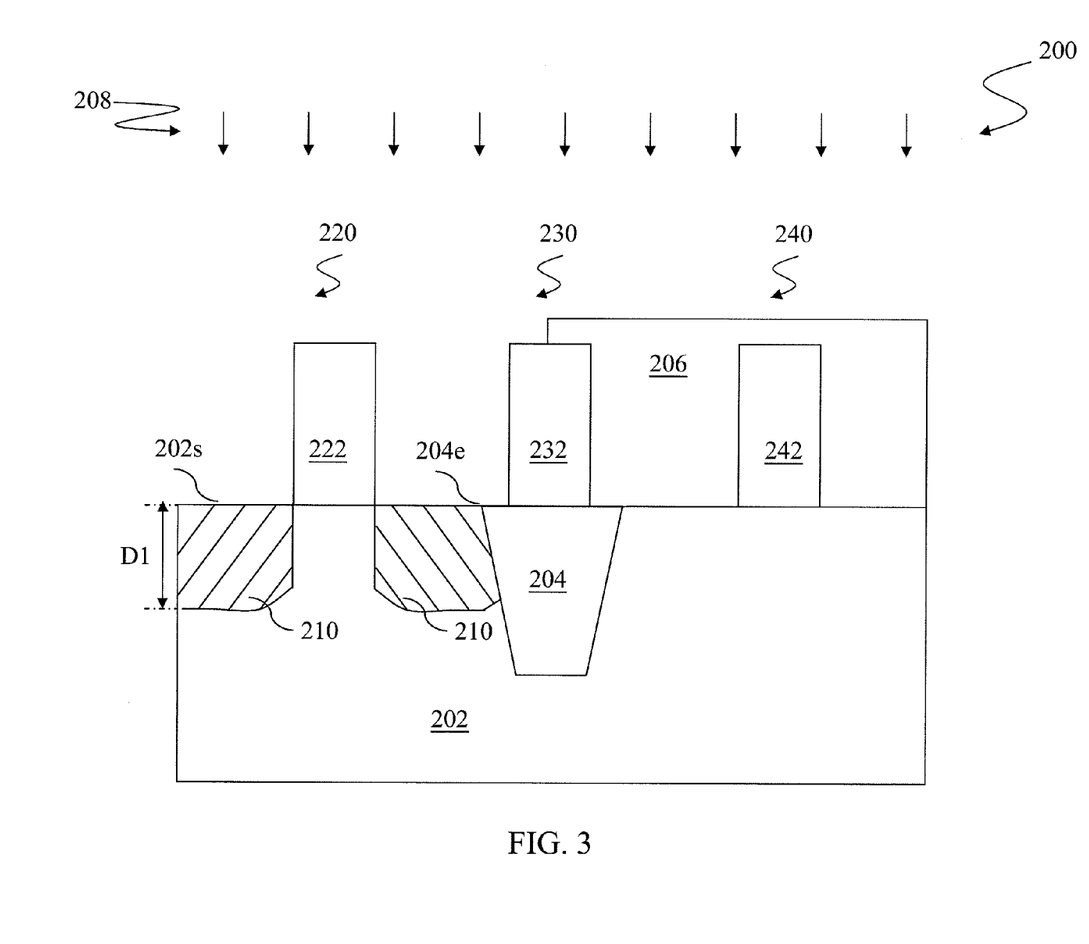

Referring to FIGS. 1 and 3, the method 100 proceeds to step 104 wherein a pre-amorphous implantation (PAI) process 208 is performed on the substrate 202. The PAI process 208 implants the substrate 202, damaging the lattice structure of the substrate 202, and forming amorphized regions 210. In the present embodiment, the amorphized regions 210 are formed in source and drain regions on both sides of the gate structure 220. The amorphized regions 210 have a depth, D1. The depth, D1, is formed according to design specifications. The depth, D1, in some embodiments, ranges between from about 10 nanometers to about 150 nanometers. In the present embodiment, the depth, D1, is less than about 100 nanometers. The depth, D1, can be controlled by the PAI process 208, such as by controlling implant energy, implant species, and/or implant dosage. In one embodiment, the PAI process 208 implants the substrate 202 with silicon (Si) and/or germanium (Ge). In an alternative embodiment, the PAI process 208 could utilize other implant species, such as Ar, Xe, $BF_2$, As, In, other suitable implant species, or combinations thereof. In the present embodiment, the PAI process 208 implants Si and/or Ge at an implant energy ranging from about 10 KeV to about 50 KeV, and an implant dosage ranging from about $1 \times 10^{13}$ atoms/$cm^2$ to about $2 \times 10^{15}$ atoms/$cm^2$, depending on the implantation temperature. In one embodiment, the PAI process 208 is performed at room temperature (e.g. 25° C.). In an alternative embodiment, the PAI process 208 is performed at a low temperature (e.g., −60° C. to −100° C.) by adapting a Cryo (low temperature) function in the ion implanter to enhance the efficiency of amorphization. In some embodiments, the PAI process 208 is performed with a tilt angle ranging from about 0 degrees to about 20 degrees.

Alternatively, the PAI process 208 can be a multiple-step implantation process, including at least a first step and a second step of the implantation process. The first and the second steps of the implantation process are performed using a first and a second implant energy, a first and a second implant dosage, and a first and a second implant tilt angles. In one embodiment, the first and the second implant energies independently range from about 10 KeV to about 50 KeV. In another embodiment, the first implant energy is greater than the second implant energy. In one embodiment, the first and the second implant dosages independently range from about $1 \times 10^{13}$ atoms/$cm^2$ to about $2 \times 10^{15}$ atoms/$cm^2$. In another embodiment, the first implant dosage is greater than the second implant dosage. In some embodiments, a combined dosage of the first and the second implant dosages range from about $1 \times 10^{13}$ atoms/$cm^2$ to about $2 \times 10^{15}$ atoms/$cm^2$, and a ratio between the first and the second implant dosages ranges from about 1:1 to about 7:3. In one embodiment, the first and the second tilt angles independently range from about 0 degree to about 20 degrees. In another embodiment, the first implant tilt angle is greater than the second implant tilt angle.

In some embodiments, a patterned mask layer 206 is utilized to define where the amorphized regions 210 are formed and protect other regions of the semiconductor device 200 from implantation damage. For example, the patterned mask layer 206 exposes the source/drain regions on both sides of the gate structure 220, such that the source/drain regions on both sides of the gate structure 220 are exposed to the PAI process 208 (forming the amorphized regions 210) while the source/drain regions on both sides of the gate structure 240 (and other portions of the semiconductor device 200) are protected from the PAI process 208. In the present embodiment, the patterned mask layer 206 is a photoresist layer. Alternatively, the patterned mask layer 206 is a hard mask layer, such as a SiN or SiON layer. The patterned mask layer 206 may be part of the current manufacturing process (e.g., LDD or source/drain formation); thereby minimizing cost as no additional photoresist layer or hard mask is required for the PAI process 208.

Figure 4:
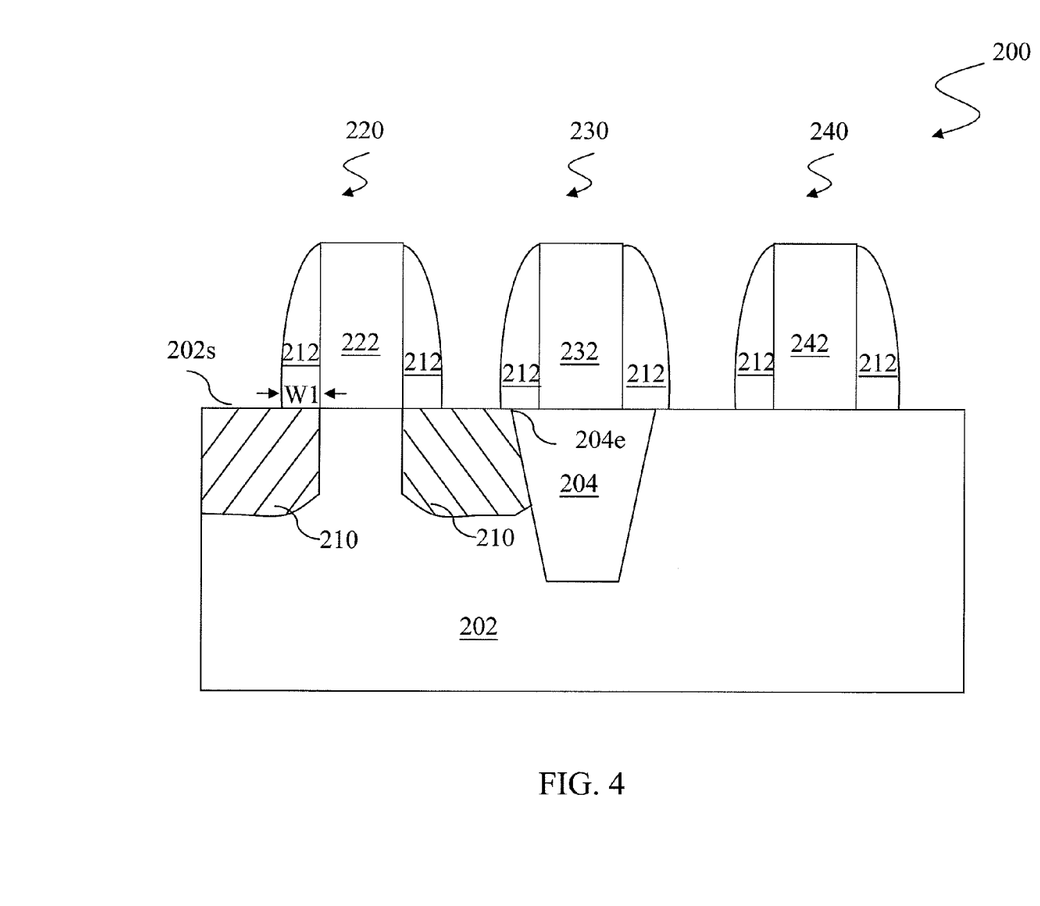

Referring to FIGS. 1 and 4, the method 100 proceeds to step 106 wherein dummy spacers 212 with a width W1 are formed adjoining sidewalls of the gate stacks 222, 232, and 242. The dummy spacers 212 include a single-layer or a multiple-layer structure. In the present embodiment, a blanket layer of dummy spacer material (not shown) is formed over the substrate 202 and the gate stacks 222, 232, and 242 by a depositing process including CVD, PVD, ALD, or other suitable techniques. In some embodiments, the spacer material comprises SiCN, silicon oxide, silicon nitride, silicon oxy-nitride, other suitable material, or combinations thereof. In the present embodiment, the spacer material is formed under a process temperature less than about 500° C., to prevent the amorphized regions 210 re-crystallized during this stage. Then, an anisotropic etching process is performed on the dummy spacer material to form the dummy spacers 212. In some embodiments, the spacer material has a thickness greater than about 6 nm, such that the dummy spacers 212 extend beyond the edges 204e of the isolation region 204.

Figure 5:
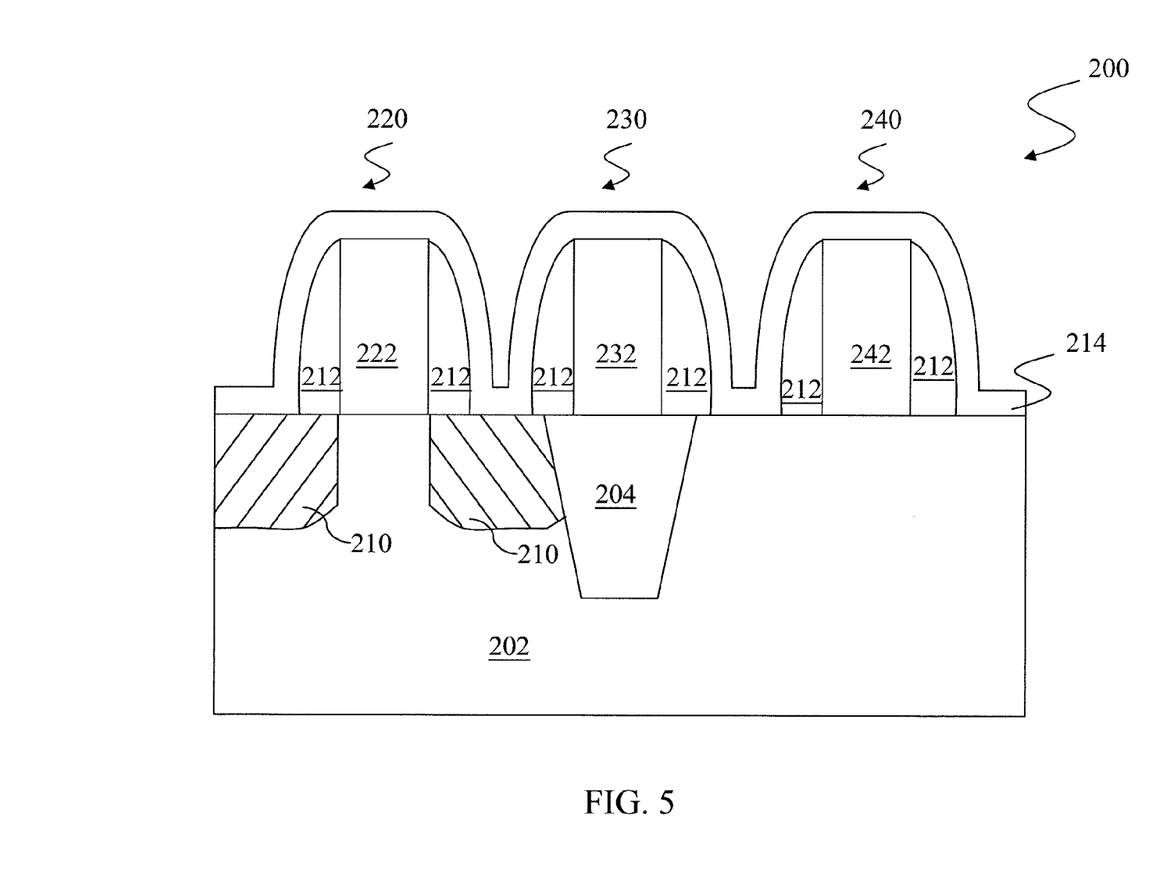

Referring to FIGS. 1 and 5, the method 100 proceeds to step 108 wherein a stress film 214 is deposited over the substrate 202 and the gate stacks 222, 232, and 242. The stress film 214 may be formed by chemical vapor deposition (CVD), physical vapor deposition (PVD), atomic layer deposition (ALD), high density plasma CVD (HDPCVD), plating, other suitable methods, and/or combinations thereof. The stress film 214 may include a dielectric material, such as silicon nitride, silicon oxide, silicon oxynitride, other suitable materials, and/or combinations thereof. In the present embodiment, the stress film 214 is formed under a process temperature less than about 500° C., to prevent the amorphized regions 210 re-crystallized during this stage. In some embodiments, the stress film 214 is used to provide tensile stress in a subsequent annealing process 216 to recrystallize the amorphized regions 210.

Figure 6:
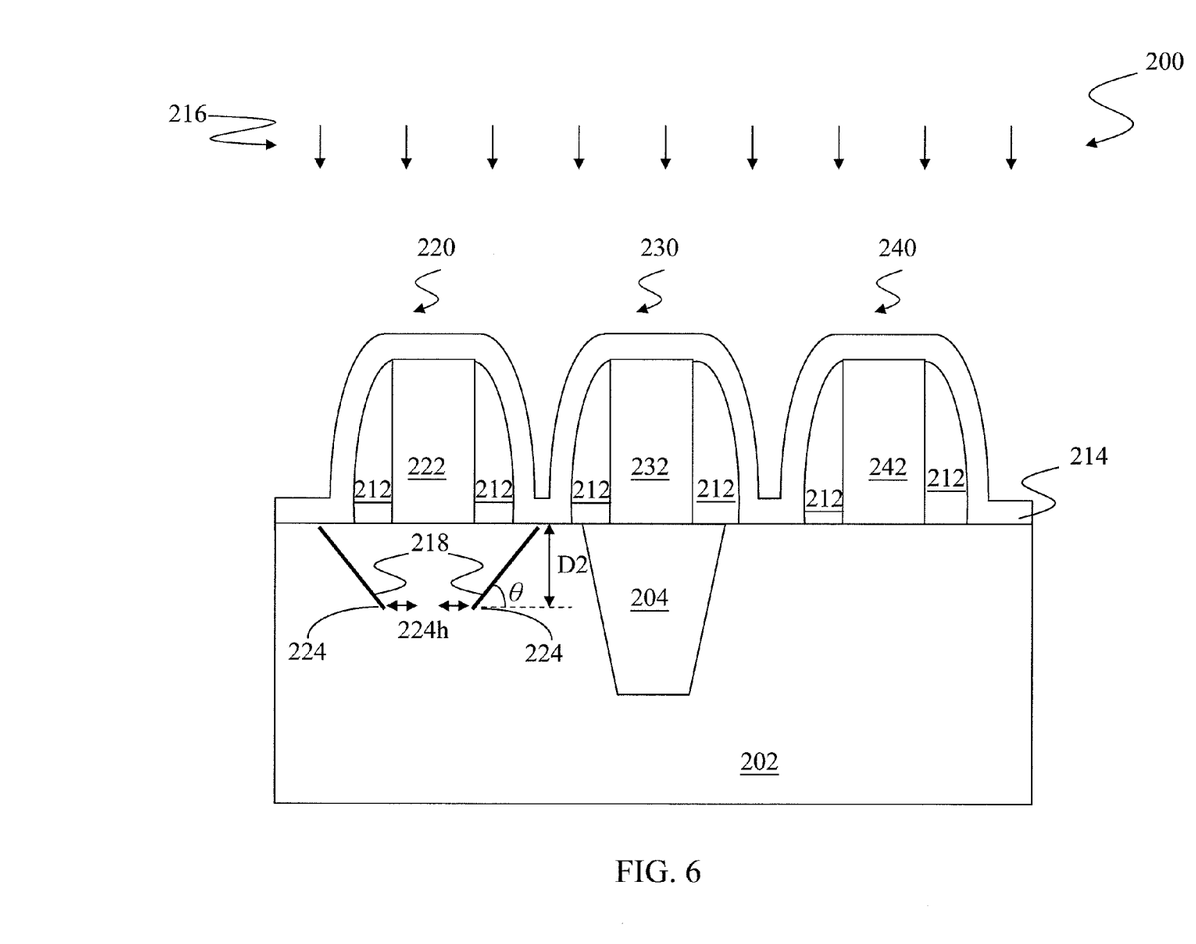

Referring to FIGS. 1 and 6, the method 100 proceeds to step 110 wherein, an annealing process 216 is performed on the substrate 202. In some embodiments, the annealing process 216 is a furnace annealing process, rapid thermal annealing (RTA) process, spike RTA, or a millisecond thermal annealing (MSA) process (e.g., millisecond laser thermal annealing process). In one embodiment, the annealing process 216 includes a furnace annealing process performed at a temperature ranging from about 400° C. to about 750° C., lasting for a period of time ranging from about 1 minute to about 10 hours. In another embodiment, the annealing process 216 includes a RTA process performed at a temperature ranging from about 400° C. to about 750° C., lasting for a period of time ranging from about 10 seconds to about 5 minutes. In an alternative embodiment, the annealing process 216 includes a spike RTA process performed at a temperature ranging from about 990° C. to about 1050° C., lasting for a period of time ranging from about 0.1 seconds to about 2 seconds. Alternatively, the annealing process 216 may further include a pre-heat step. In some embodiments, the pre-heat step may be performed at a temperature ranging from about 400° C. to about 750° C., lasting for a period of time ranging from about 10 seconds to about 5 minutes. In the present embodiment, the pre-heat step is performed at a temperature of about 550° C. lasting for about 10 seconds to about 60 seconds.

During the annealing process 216, as the amorphized regions 210 being re-crystallized, dislocations 218 are formed in the substrate 210. As mentioned above, the amorphized regions 210 are maintained as amorphized without being re-crystallized before performing the annealing process 216 by forming the dummy spacers 212 and the stress film 214 at temperatures less than about 500° C. Therefore, the dislocations 218 can be formed after the annealing process 216. As mentioned above, the dummy spacers 212 extend beyond the edges 204e of the isolation region 204. Therefore, one of the dislocations 218 adjacent to the isolation region 204 can be formed after the annealing process 216. In some embodiments, the dislocations 218 are formed in a <111> direction. In some embodiments, the <111> direction has an angle θ1, measured with respect to an axis parallel to the surface 202s of the substrate 202, ranging from about 45 to about 65 degrees. In the present embodiment, the dislocations 218 have <111> direction with the angle θ of about 55 degrees.

The dislocations 218 are formed starting at pinchoff points 224. The pinchoff points 224 have a depth D2 measured from the surface 202s of the substrate 202. In some embodiments, the depth D2 of the pinchoff points 224 ranges from about 10 nanometers to about 150 nanometers. In the present embodiment, the depth D2 of the pinchoff points 224 ranges from about 10 nanometers to about 30 nanometers. The pinchoff points 224 have a horizontal buffer (proximity) 224h measured from an adjacent gate edge of the gate stack 222. The horizontal buffer 224h and the depth D2 are formed according to design specifications and are a function of the annealing process 216. In some embodiments, the horizontal buffer 224h of the pinchoff points 224 ranges from about −5 nanometers to about 15 nanometers ("-" represents the pinchoff points 224 are under the gate stack 222). The pinchoff points 224 may be formed such that they are not disposed within the channel region.

Figure 7:
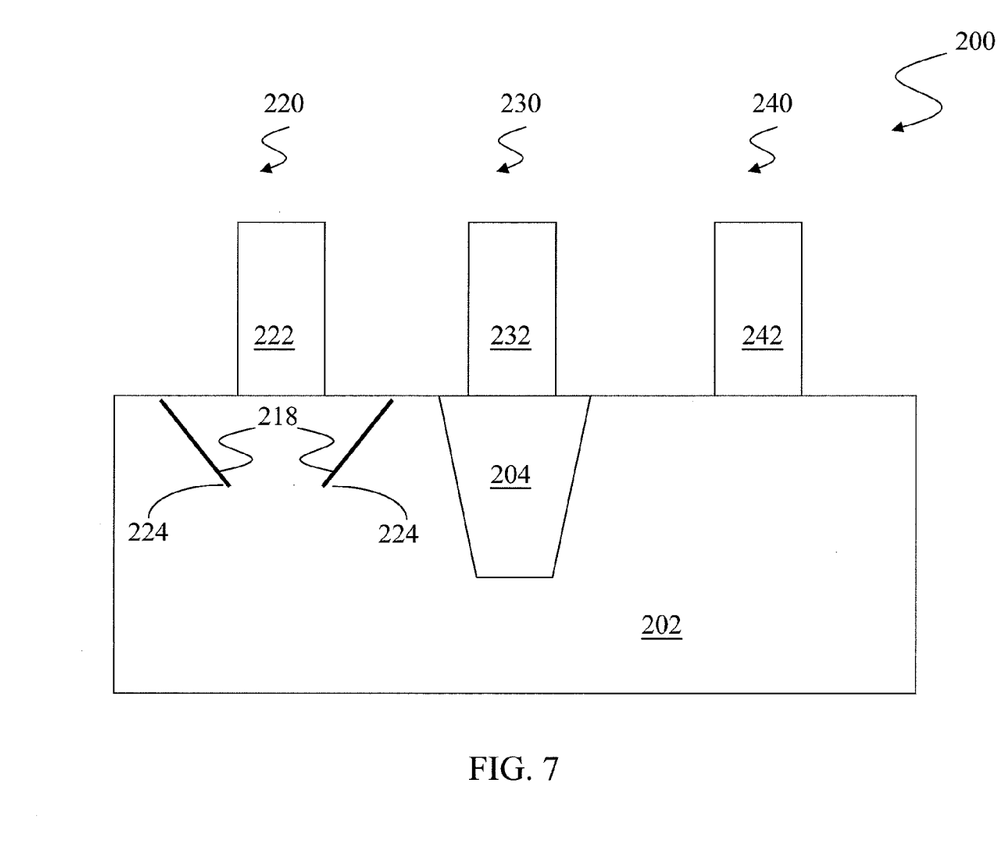

Referring to FIGS. 1 and 7, the method 100 proceeds to step 112 wherein the stress film 214 is removed from the substrate 202, the gate stacks 222, 232, and 242. The stress film 214 is removed, for example, by a wet etching using phosphoric acid or hydrofluoric acid, or by a dry etching using suitable etchant. Still referring to FIG. 7, the method 100 proceeds to step 114 wherein the dummy spacers 212 are removed. The dummy spacers 212 are removed, for example, by a wet etching using phosphoric acid or hydrofluoric acid, or by a dry etching using suitable etchant. In one embodiment, the stress film 214 and the dummy spacers 212 are removed using a single etching process. Alternatively, the stress film 214 and the dummy spacers 212 are removed using a multiple etching processes.

Figure 8:
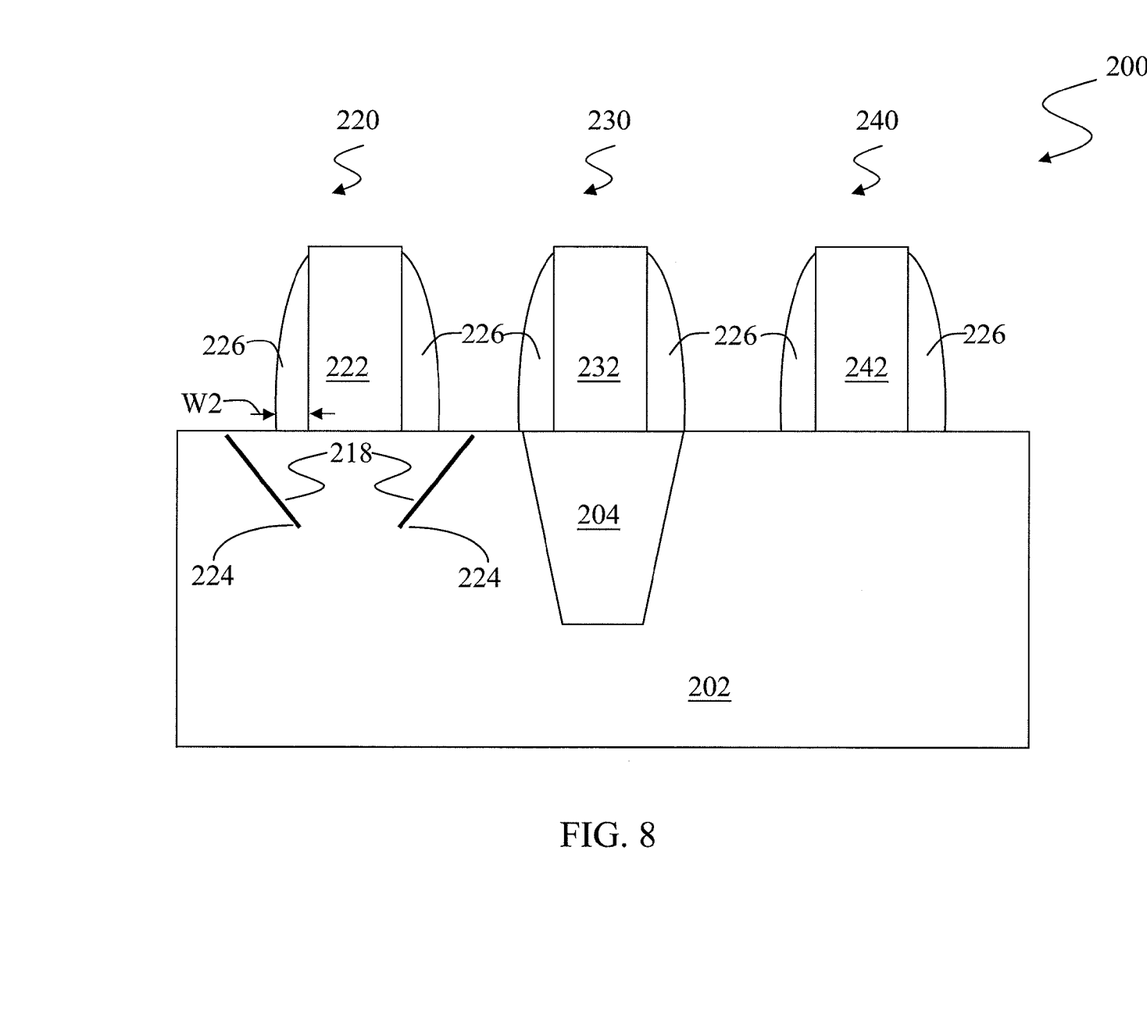

Referring to FIGS. 1 and 8, the method 100 proceeds to step 116 wherein gate spacers 226 having a width W2 are formed adjoining sidewalls of the gate stacks 222, 232, and 242. In the present embodiment, the width W2 of the gate spacers 226 is less than the width W1 of the dummy spacers 212. In the present embodiment, a blanket layer of gate spacer material (not shown) is formed over the substrate 202 and the gate stacks 222, 232, and 242 by a depositing process including CVD, PVD, ALD, or other suitable techniques. In the present embodiment, the gate spacer material has a thickness less than the thickness of the dummy spacer material to form the gate spacers 226 having the width W2 less than the width W1 of the dummy spacers 212. In some embodiments, the gate spacer material comprises SiCN, silicon oxide, silicon nitride, silicon oxy-nitride, other suitable material, or combinations thereof. In some embodiments, the gate spacers 226 have a thickness ranging from about 5 nanometers to about 15 nanometers. In some embodiments, the gate spacers 226 do not extend beyond the edges 204e of the isolation region 204. Alternatively, the gate spacers 226 extend beyond the edges 204e of the isolation region 204. An anisotropic etching process is performed on the gate spacer material to form the gate spacers 226.

Figure 9:
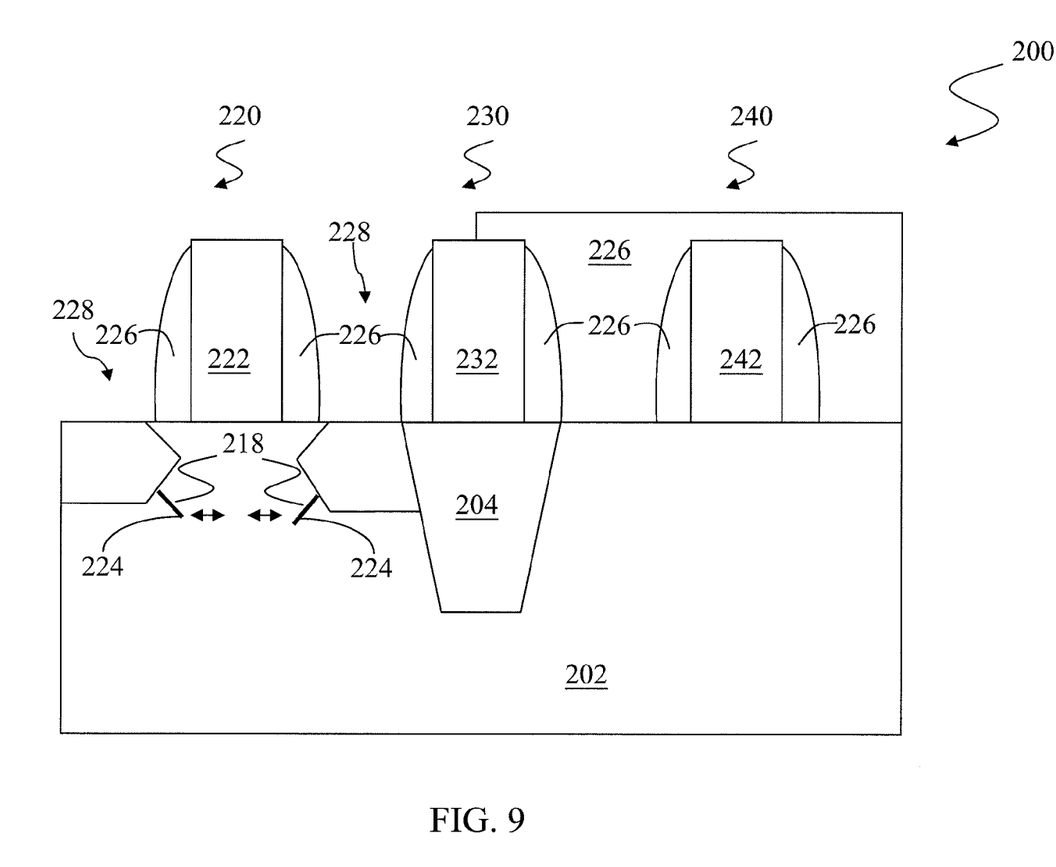

Referring to FIGS. 1 and 9, the method 100 proceeds to step 118 wherein recess cavities 228 are formed in the substrate 202. The recess cavities 228, for example, are adjacent to edges of the gate spacers 224 of the gate structure 220. In some embodiments, the recess cavities 228 are source and drain (S/D) recess cavities. In the present embodiment, the processes for forming the recess cavities 228 are started using an isotropic dry etching process, followed by an anisotropic wet or dry etching process. In some embodiments, the isotropic dry etching process is performed using the gate spacers 224 as hard masks to recess the surface 202s of the substrate 202. In some embodiments, the etching processes remove the upper portion of the dislocations 218 while leave the lower portion of the dislocations 218 with pinchoff points 224.

In some embodiments, a patterned mask layer 226 is utilized to define where the recess cavities 228 are formed and protect other regions of the substrate 202 from being recessed. For example, the patterned mask layer 226 exposes the source/drain regions on both sides of the gate structure 220, such that the source/drain regions on both sides of the gate structure 220 are exposed to the etching processes (forming the recess cavities 228) while the source/drain regions on both sides of the gate structure 240 (and other portions of the semiconductor device 200) are protected from the etching processes. In the present embodiment, the patterned mask layer 226 is a photoresist layer. Alternatively, the patterned mask layer 226 is a hard mask layer, such as a SiN or SiON layer. The patterned mask layer 226 is removed after forming the recess cavities 228.

Figure 10:
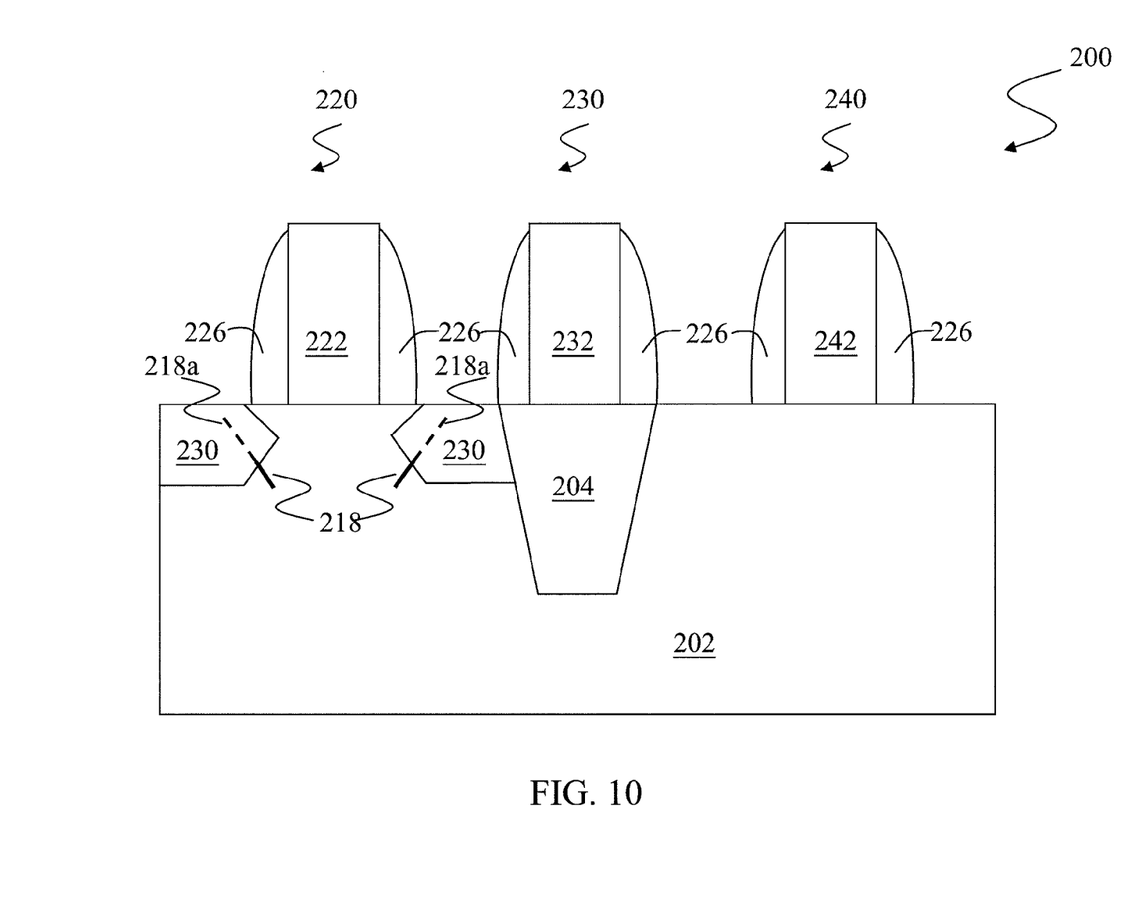

Referring to FIGS. 1 and 10, the method 100 proceeds to step 120 wherein source/drain (S/D) features 230 (also referred to as strained structures) are formed in the recess cavities 228 on both sides of the gate structure 220. The source/drain (S/D) features 230, for example, are strained materials grown in the recess cavities 228 using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epitaxial processes, or combinations thereof. In some embodiments, the strained materials include Si or SiC. In some embodiments, dislocations 218a are in the source/drain (S/D) features 230. In the present embodiment, the dislocations 218a are formed along a line defined by the lower portion of the dislocations 218. In the present embodiment, the dislocations 218a are located at the place substantially the same as the original place of the removed upper portion of the dislocation 218.

A benefit of utilizing wide spacers for forming the dislocations, in accordance with the disclosed embodiments, is the enhancement of consistency of dislocations formed adjacent to the isolation regions within the active region (e.g., source/drain). The method may therefore improve the stress within the channel region. Moreover, after the formation of dislocations, in accordance with the disclosed embodiments, the method has the benefit of utilizing narrow spacers to decrease the aspect ratio. The method may therefore improve the gap filling process in a subsequent formation process of inter-layer dielectric (ILD). Thus, the disclosed embodiments provide increased stress in the channel region to improve carrier mobility without adding significant cost to the manufacturing process and/or device. It is understood that different embodiments may have different advantages, and that no particular advantage is necessarily required of any embodiment.

The semiconductor device may undergo further CMOS or MOS technology processing to form various features known in the art. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer reacts with silicon to form a silicide, and then removing the non-reacted metal layer. An inter-level dielectric (ILD) layer can further be formed on the substrate and a chemical mechanical polishing (CMP) process can further be applied to the substrate to planarize the substrate. Further, a contact etch stop layer (CESL) may be formed on top of the gate structures before forming the ILD layer.

In an embodiment, the gate stacks comprise polysilicon in the final device. In another embodiment, a gate replacement process (or gate last process) is performed, where the polysilicon gate stacks are replaced with metal gates. The metal gates include liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a method of manufacturing a semiconductor device, comprises forming an isolation feature in a substrate; forming a first gate stack and a second gate stack over the substrate, wherein the first gate stack is substantially atop the isolation feature; performing a pre-amorphous implantation process on the substrate; forming spacers adjoining sidewalls of the first gate stack, wherein one of the spacers adjacent to the second gate stack extends beyond an edge the isolation feature; forming a stress film over the substrate; and performing an annealing process on the substrate and the stress film; removing the stress film.

In another embodiment, a method of manufacturing a semiconductor device, comprises providing a substrate with an isolation feature therein; forming a first gate stack, a second gate stack, and a third gate stack over the substrate, wherein the second gate stack is located between the first and the third gate stacks and atop the isolation feature; forming amorphized regions adjacent to edges of the first gate stack in the substrate; forming spacers adjoining sidewalls of the first, the second, and the third gate stacks, wherein at least one of the spacers adjoining sidewalls of the second gate stack extend beyond an edge of the isolation feature; depositing a stress film over the first, the second, and the third gate stacks, and the amorphized regions; performing an annealing process such that the amorphized regions re-crystallize to form dislocations; removing the stress film; and removing the spacers.

In still another embodiment, a method of manufacturing a semiconductor device, comprises providing a substrate with an isolation feature therein; forming a first gate stack, a second gate stack, and a third gate stack over the substrate, wherein the second gate stack is located between the first and the third gate stacks and atop the isolation feature; forming amorphized regions adjacent to edges of the first gate stack in the substrate; forming dummy spacers adjoining sidewalls of the first, the second, and the third gate stacks, wherein at least one of the spacers adjoining sidewalls of the second gate stack extend beyond an edge of the isolation feature; depositing a stress film over the first, the second, and the third gate stacks, and the amorphized regions; performing an annealing process such that the amorphized regions re-crystallize to form dislocations; removing the stress film; removing the dummy spacers; forming gate spacers adjoining sidewalls of the first, the second, and the third gate stacks, wherein the gate spacers have a width less than a width of the dummy spacers; forming recesses adjacent to edges of the gate spacers of the first gate stack in the substrate; and growing source/drain (S/D) features in the recesses.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming an isolation feature in a substrate;
    forming a first gate stack and a second gate stack over the substrate, wherein the first gate stack is substantially atop the isolation feature;
    performing a pre-amorphous implantation process on the substrate, thereby forming amorphized regions;
    forming spacers adjoining sidewalls of the first gate stack and the second gate stack, wherein one of the spacers adjacent to the second gate stack extends beyond an edge of the isolation feature;
    forming a stress film over the substrate;
    performing an annealing process on the substrate;
    removing the stress film;
    removing the spacers after removing the stress film; and
    forming gate spacers adjoining sidewalls of the first gate stack after removing the spacers,
    wherein the gate spacers have a width less than a width of the spacers.

2. The method of claim 1, wherein forming the spacers performed at a temperature less than about 500° C.

3. The method of claim 1, wherein forming the stress film performed at a temperature less than about 500° C.

4. The method of claim 1, wherein first dislocations are formed in source/drain (S/D) regions of the second gate stack in the step of performing the annealing process.

5. The method of claim 4, further comprising:
    removing portions of the substrate to form recesses adjacent to edges of the second gate stack, wherein the step of removing removes upper portions of the first dislocations while leaving lower portions of the first dislocations.

6. The method of claim 5, further comprising:
    forming epitaxial features in the recesses, wherein the epitaxial features include second dislocations along a line defined by the lower portion of the first dislocations.

7. The method of claim 1, wherein the step of performing the pre-amorphous implantation process introduces the substrate with silicon (Si) or germanium (Ge) implant species.

8. The method of claim 1, wherein the step of performing the pre-amorphous implantation process includes utilizing an implantation energy from about 10 KeV to about 50 KeV.

9. The method of claim 1, wherein performing the pre-amorphous implantation process includes utilizing an implantation dosage from about $1 \times 10^{13}$ atoms/cm$^2$ to about $2 \times 10^{15}$ atoms/cm$^2$.

10. The method of claim 1, wherein performing the annealing process includes performing a rapid thermal annealing (RTA) process at a temperature from about 400° C. to about 750° C. for a period of time from about 10 seconds to about 5 minutes.

11. The method of claim 1, wherein performing the annealing process includes performing a spike rapid thermal annealing (RTA) process at a temperature from about 990° C. to about 1050° C. for a period of time from about 0.1 seconds to about 2 seconds.

12. The method of claim 1, wherein the stress film is silicon nitride, silicon oxide, silicon oxynitride, or combinations thereof.

13. The method of claim 1, wherein the spacers are SiCN, silicon oxide, silicon nitride, silicon oxy-nitride, or combinations thereof.

14. A method of manufacturing a semiconductor device, comprising:
   providing a substrate with an isolation feature therein;
   forming a first gate stack, a second gate stack, and a third gate stack over the substrate, wherein the second gate stack is located between the first and the third gate stacks and atop the isolation feature;
   forming amorphized regions adjacent to edges of the first gate stack in the substrate;
   forming spacers adjoining sidewalls of the first, the second, and the third gate stacks, wherein at least one of the spacers adjoining sidewalls of the second gate stack extend beyond an edge of the isolation feature;
   depositing a stress film over the first, the second, and the third gate stacks, and the amorphized regions;
   performing an annealing process such that the amorphized regions re-crystallize to form dislocations;
   removing the stress film;
   removing the spacers after removing the stress film; and
   forming gate spacers adjoining sidewalls of the first, the second, and the third gate stacks after removing the spacers,
   wherein the gate spacers have a width less than a width of the spacers.

15. The method of claim 14, wherein the steps of forming the spacers and depositing the stress film performed at a temperature less than about 500° C.

16. A method of manufacturing a semiconductor device, comprising:
   providing a substrate with an isolation feature therein;
   forming a first gate stack, a second gate stack, and a third gate stack over the substrate, wherein the second gate stack is located between the first and the third gate stacks and atop the isolation feature;
   forming amorphized regions adjacent to edges of the first gate stack in the substrate;
   forming dummy spacers adjoining sidewalls of the first, the second, and the third gate stacks, wherein at least one of the spacers adjoining sidewalls of the second gate stack extend beyond an edge of the isolation feature;
   depositing a stress film over the first, the second, and the third gate stacks, and the amorphized regions;
   performing an annealing process such that the amorphized regions re-crystallize to form dislocations;
   removing the stress film;
   removing the dummy spacers;
   forming gate spacers adjoining sidewalls of the first, the second, and the third gate stacks, wherein the gate spacers have a width less than a width of the dummy spacers;
   forming recesses adjacent to edges of the gate spacers of the first gate stack in the substrate; and
   growing source/drain (S/D) features in the recesses.

17. The method of claim 14, wherein forming the stress film is performed at a temperature less than about 500° C.

18. The method of claim 14, wherein first dislocations are formed in source/drain (S/D) regions of the second gate stack in the step of performing the annealing process.

19. The method of claim 18, further comprising:
   removing portions of the substrate to form recesses adjacent to edges of the second gate stack, wherein the step of removing removes upper portions of the first dislocations while leaving lower portions of the first dislocations.

20. The method of claim 14, wherein the stress film is silicon nitride, silicon oxide, silicon oxynitride, or combinations thereof.

* * * * *